US009396080B2

(12) United States Patent
Malshe et al.

(10) Patent No.: US 9,396,080 B2
(45) Date of Patent: Jul. 19, 2016

(54) STORAGE MODULE AND METHOD FOR ANALYSIS AND DISPOSITION OF DYNAMICALLY TRACKED READ ERROR EVENTS

(71) Applicant: SanDisk Technologies Inc., Plano, TX (US)

(72) Inventors: Ashutosh Malshe, Fremont, CA (US); Neil Richard Darragh, Edinburgh (GB); Karthik Krishnamoorthy, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 154 days.

(21) Appl. No.: 14/454,482

(22) Filed: Aug. 7, 2014

(65) Prior Publication Data

US 2016/0041891 A1 Feb. 11, 2016

(51) Int. Cl.
*G06F 11/00* (2006.01)
*G06F 11/20* (2006.01)
*G06F 11/07* (2006.01)

(52) U.S. Cl.
CPC .......... *G06F 11/2094* (2013.01); *G06F 11/073* (2013.01); *G06F 11/076* (2013.01); *G06F 11/0793* (2013.01); *G06F 2201/81* (2013.01)

(58) Field of Classification Search
CPC .............. G06F 11/2094; G06F 11/073; G06F 11/0793; G06F 11/076; G06F 2201/81; G06F 11/1068; G06F 11/1048; G06F 2212/7205; G06F 12/0246; G06F 12/00; G06F 11/10; G11C 11/5628; G11C 11/5642; G11C 16/0483; G11C 16/349; G11C 16/3418; G11C 2211/5644
See application file for complete search history.

(56) References Cited

U.S. PATENT DOCUMENTS

| | | | | |
|---|---|---|---|---|
| 7,173,852 | B2 | 2/2007 | Gorobets et al. | |
| 2008/0077841 | A1 | 3/2008 | Gonzalez et al. | |
| 2009/0319868 | A1 | 12/2009 | Sharon et al. | |
| 2011/0099460 | A1* | 4/2011 | Dusija | G11C 11/5621 714/773 |
| 2012/0284574 | A1* | 11/2012 | Avila | G11C 16/28 714/704 |
| 2012/0304039 | A1* | 11/2012 | Peterson | G06F 11/10 714/773 |
| 2013/0024605 | A1* | 1/2013 | Sharon | G06F 11/1072 711/103 |
| 2013/0031443 | A1* | 1/2013 | Oh | G11C 11/5628 714/773 |
| 2014/0089765 | A1* | 3/2014 | Xing | G06F 11/1068 714/773 |
| 2015/0067415 | A1* | 3/2015 | Miyamoto | G06F 11/073 714/704 |
| 2015/0177995 | A1* | 6/2015 | Camp | G06F 12/00 711/103 |

* cited by examiner

*Primary Examiner* — Guerrier Merant
(74) *Attorney, Agent, or Firm* — Brinks Gilson & Lione

(57) ABSTRACT

A method for analyzing a read error event is provided comprising reading a page of data stored in memory, determining a read error event for the page of data, and identifying a scope of the read error event in the memory. In another embodiment, a method for performing a preliminary read error recovery is provided comprising reading a first data unit from memory and identifying a bit error rate for a first data unit with a correction engine, determining that the bit error rate is above a threshold, accessing a data structure including entries identifying data units and read error event information associated with the data units, identifying a second data unit in an entry that matches the first data unit, and performing a preliminary read error recovery process on the first data unit using the information in the entry to reduce the bit error rate below the threshold.

16 Claims, 7 Drawing Sheets

| | 402 | 404 | 406 | 408 |
|---|---|---|---|---|
| | MU Address | General Parms. | ECC Parms. | Adjusted Theshold Voltages |
| $MU_1$ | | | | |
| $MU_2$ | | | | |
| ⋮ | ⋮ | ⋮ | ⋮ | ⋮ |
| $MU_N$ | | | | |

| 502 | 504 | 506 | 508 |
|---|---|---|---|
| Initial Treshold Voltages | Read Error Event Type | ECC Power Mode Flag | Adjusted Threshold Voltage Flag |

| 602 | 604 |
|---|---|
| ECC Power Mode | Soft Bits |

STORAGE MODULE AND METHOD FOR ANALYSIS AND DISPOSITION OF DYNAMICALLY TRACKED READ ERROR EVENTS

BACKGROUND

Storage modules may include a correction engine that performs error correction on data that is read from memory before sending the data to a host. If the amount of errors is too large, the errors may be uncorrectable. Various error recovery mechanisms may be used to reduce the number of errors. If use of the recovery mechanisms sufficiently reduces the errors, the data may be sent to the host. Data relocation procedures may be performed when the amount of errors are too high. Often times, when a read of data yields too high of errors, reads of neighboring data may also yield too high of errors. However, because only the initial data and not the neighboring data was read, the high errors associated with the neighboring data may not be realized until a later time when that data is read.

OVERVIEW

Embodiments of the present invention are defined by the claims, and nothing in this section should be taken as a limitation on those claims.

By way of introduction, the below embodiments relate to a storage module and method for analysis and disposition of dynamically tracked read error events. In one embodiment, a method for analyzing a read error event is provided comprising reading a page of data stored in memory, determining a read error event for the page of data, and identifying a scope of the read error event in the memory. In another embodiment, a method for performing a preliminary read error recovery is provided comprising reading a first data unit from memory and identifying a bit error rate for a first data unit with a correction engine, determining that the bit error rate is above a threshold, accessing a data structure including entries identifying data units and read error event information associated with the data units, identifying a second data unit in an entry that matches the first data unit, and performing a preliminary read error recovery process on the first data unit using the information in the entry to reduce the bit error rate below the threshold.

Other embodiments are possible, and each of the embodiments can be used alone or together in combination. Accordingly, various embodiments will now be described with reference to the attached drawings.

DETAILED DESCRIPTION OF THE PRESENTLY

Preferred Embodiments

As mentioned in the background section above, in some situations, when data is read and a large amount of errors associated with data is identified, neighboring data may also have a large amount of associated errors. However, these errors may not be identified until the neighboring data is read. The following embodiments can be used to determine a scope of errors after an initial error event is determined in order to proactively identify areas of data that may need corrective action. The following embodiments can also dynamically keep track of errors and can be used to expedite a read error recovery process. Before turning to these and other embodiments, the following paragraphs provide a discussion of exemplary storage modules that can be used with these embodiments. Of course, these are just examples, and other suitable types of storage modules can be used.

Figure 1:
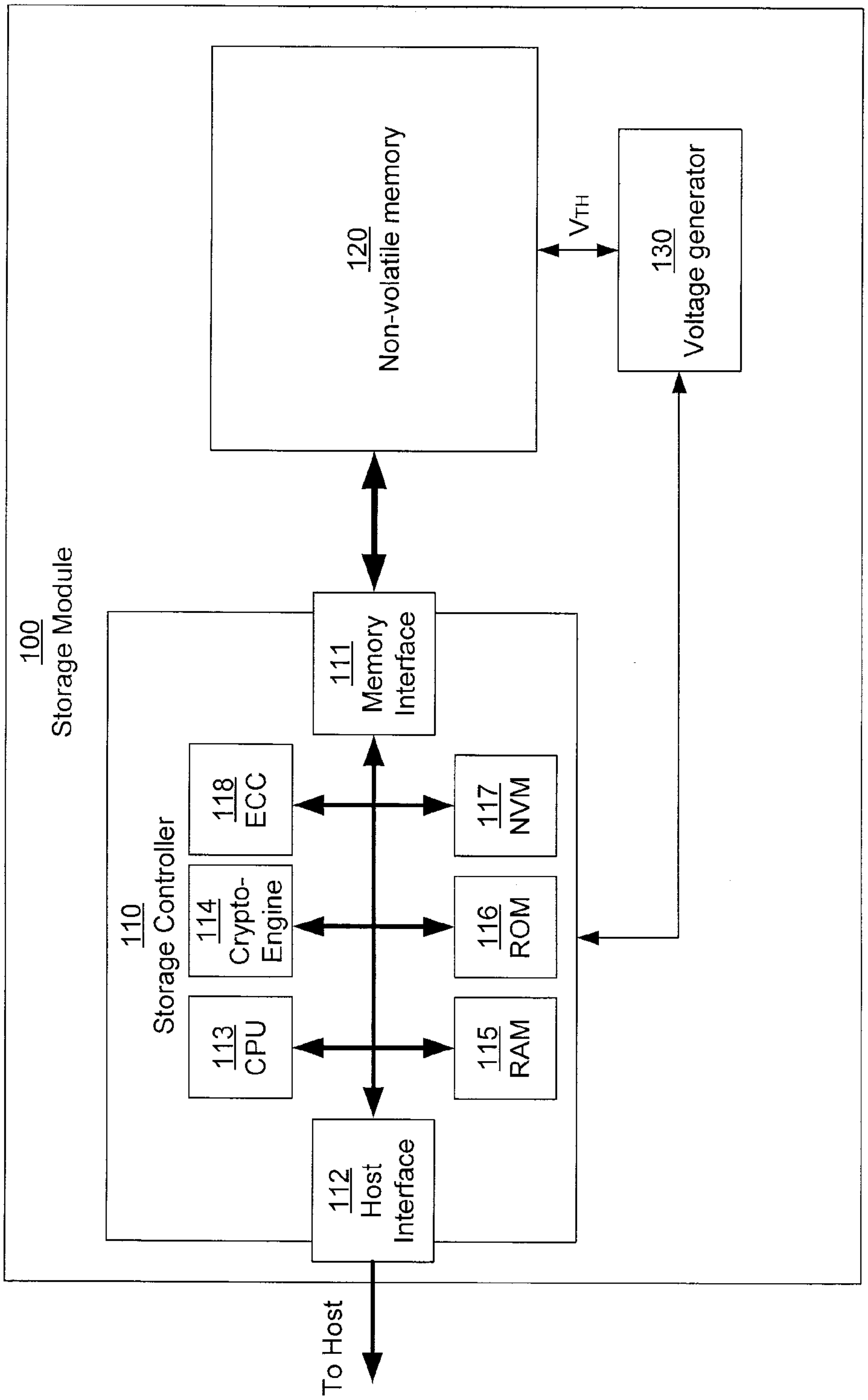
FIG. 1 is a block diagram of an exemplary storage module of an embodiment.

As illustrated in FIG. 1, a storage module 100 of one embodiment comprises a storage controller 110 and non-volatile memory 120. The storage controller 110 comprises a memory interface 111 for interfacing with the non-volatile memory 120 and a host interface 112 for placing the storage module 100 operatively in communication with a host controller. As used herein, the phrase "operatively in communication with" could mean directly in communication with or indirectly in (wired or wireless) communication with through one or more components, which may or may not be shown or described herein.

Figure 2A:
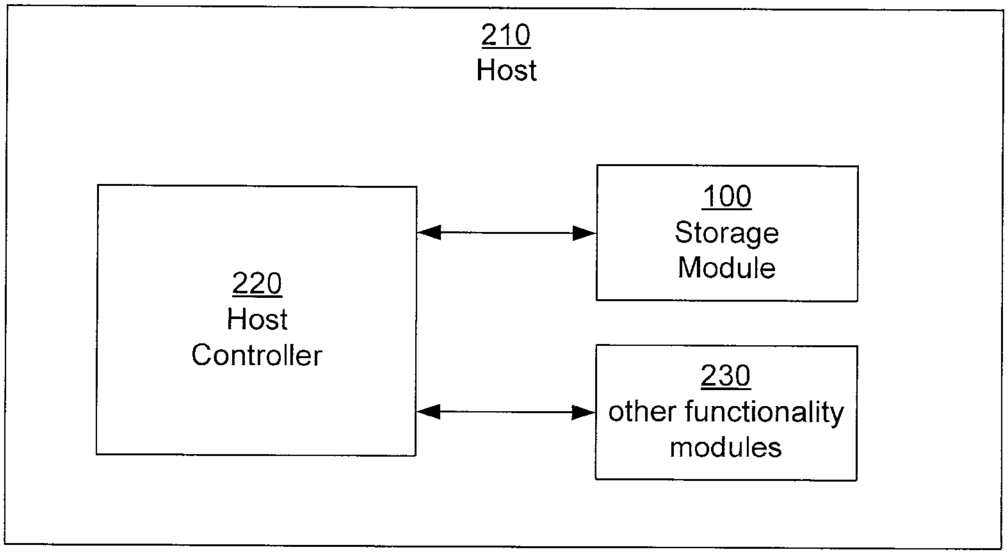
FIG. 2A is a block diagram of a host of an embodiment, where the exemplary storage module of FIG. 1 is embedded in the host.

As shown in FIG. 2A, the storage module 100 can be embedded in a host 210 having a host controller 220. That is, the host 210 embodies the host controller 220 and the storage module 100, such that the host controller 220 interfaces with the embedded storage module 100 to manage its operations. For example, the storage module 100 can take the form of an iNAND™ eSD/eMMC embedded flash drive by SanDisk Corporation, or, more generally, any type of solid state drive (SSD), a hybrid storage device (having both a hard disk drive and a solid state drive), and a memory caching system. The host controller 220 can interface with the embedded storage module 100 using, for example, an eMMC host interface or a UFS interface. The host 210 can take any foam, such as, but not limited to, a mobile phone, a tablet computer, a digital media player, a game device, a personal digital assistant (PDA), a mobile (e.g., notebook, laptop) personal computer (PC), or a book reader. As shown in FIG. 2A, the host 210 can include optional other functionality modules 230. For example, if the host 210 is a mobile phone, the other functionality modules 230 can include hardware and/or software components to make and place telephone calls. As another example, if the host 210 has network connectivity capabilities, the other functionality modules 230 can include a network interface. Of course, these are just some examples, and other implementations can be used. Also, the host 210 can include other components (e.g., an audio output, input-output ports, etc.) that are not shown in FIG. 2A to simplify the drawing. It should be noted that while the host controller 220 can control the storage module 100, the storage module 100 can have its own controller to control its internal memory operations.

Figure 2B:
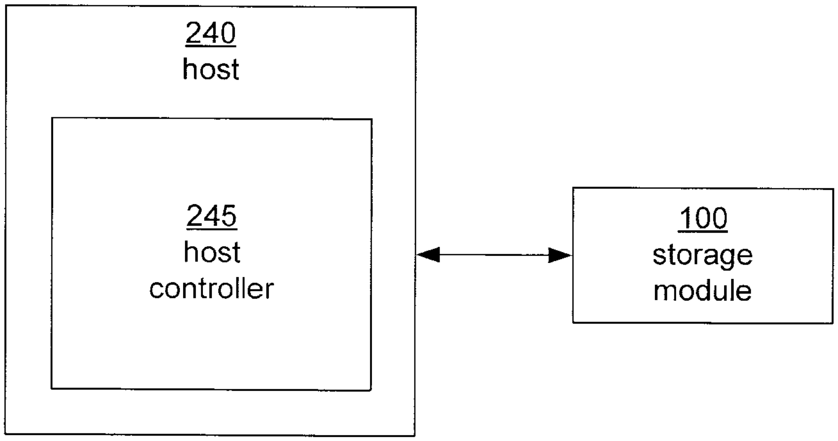
FIG. 2B is a block diagram of the exemplary storage module of FIG. 1 removably connected to a host, where the storage module and host are separable, removable devices.

As shown in FIG. 2B, instead of being an embedded device in a host, the storage module 100 can have physical and electrical connectors that allow the storage module 100 to be removably connected to a host 240 (having a host controller 245) via mating connectors. As such, the storage module 100 is a separate device from (and is not embedded in) the host 240. In this example, the storage module 100 can be a handheld, removable memory device, such as a Secure Digital (SD) memory card, a micro SD memory card, a Compact Flash (CF) memory card, a universal serial bus (USB) device (with a USB interface to the host), or a solid-state drive (SSD), and the host 240 is a separate device, such as a mobile phone, a tablet computer, a digital media player, a game device, a personal digital assistant (PDA), a mobile (e.g., notebook, laptop) personal computer (PC), or a book reader, for example.

In FIGS. 2A and 2B, the storage module 100 is in communication with a host controller 220 or host 240 via the host interface 112 shown in FIG. 1. The host interface 112 can take any suitable form, such as, but not limited to, an eMMC host interface, a UFS interface, and a USB interface. The host interface 110 in the storage module 110 conveys memory management commands from the host controller 220 (FIG. 2A) or host 240 (FIG. 2B) to the storage controller 110, and also conveys memory responses from the storage controller 110 to the host controller 220 (FIG. 2A) or host 240 (FIG. 2B). Also, it should be noted that when the storage module 110 is embedded in the host 210, some or all of the functions described herein as being performed by the storage controller 110 in the storage module 100 can instead be performed by the host controller 220.

Returning to FIG. 1, the storage controller 110 comprises a central processing unit (CPU) 113, an optional hardware crypto-engine 114 operative to provide encryption and/or decryption operations, read access memory (RAM) 215, read only memory (ROM) 116 which can store firmware for the basic operations of the storage module 100, and a non-volatile memory (NVM) 117 which can store a device-specific key used for encryption/decryption operations, when used. Additionally, the storage controller 110 may include a correction engine 118, such as an error correction code (ECC) engine or other type of correction engine that may check and/or correct errors in the non-volatile memory 120.

The storage controller 110 can be implemented in any suitable manner. For example, the storage controller 110 can take the form of a microprocessor or processor and a computer-readable medium that stores computer-readable program code (e.g., software or firmware) executable by the (micro)processor, logic gates, switches, an application specific integrated circuit (ASIC), a programmable logic controller, and an embedded microcontroller, for example. Suitable controllers can be obtained from SanDisk or other vendors. The storage controller 110 can be configured with hardware and/or software to perform the various functions described below and shown in the flow charts. Also, some of the components shown as being internal to the storage controller 110 can also be stored external to the storage controller 110, and other component can be used. For example, the RAM 115 (or an additional RAM unit) can be located outside of the controller die and used as a page buffer for data read from and/or to be written to the memory 120.

The non-volatile memory 120 can also take any suitable form. For example, in one embodiment, the non-volatile memory 120 takes the form of a solid-state (e.g., flash) memory and can be one-time programmable, few-time programmable, or many-time programmable. The non-volatile memory 120 can also use single-level cell (SLC), multiple-level cell (MLC), triple-level cell (TLC), or other memory technologies, now known or later developed. Also, the non-volatile memory 120 can be a two-dimensional memory or a three-dimensional memory.

Figure 3:
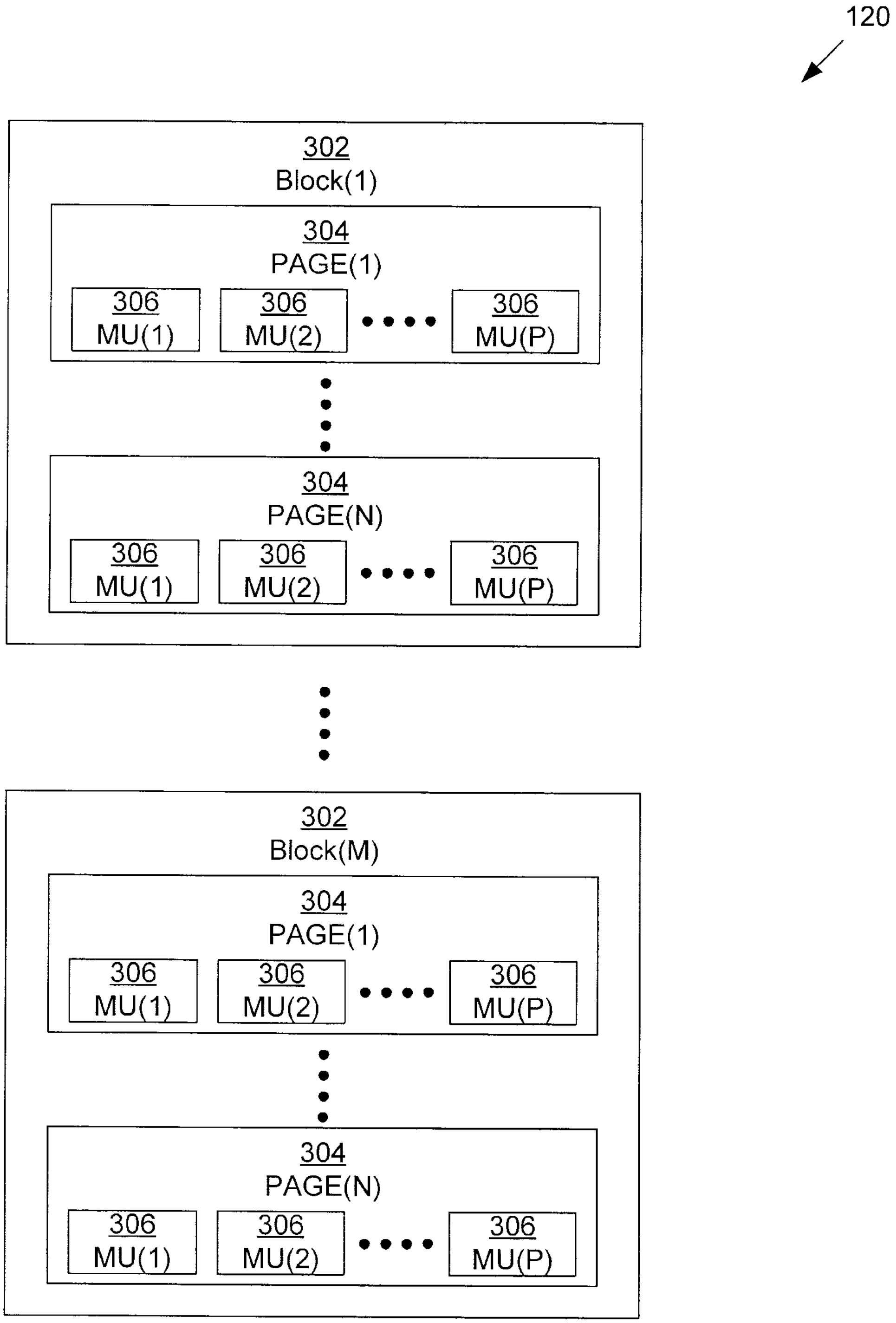
FIG. 3 is block diagram of an exemplary organization of memory in the storage module of FIG. 1.

Additionally, the non-volatile memory 120 may be divided or partitioned into blocks, pages, and management units (MU). Referring to FIG. 3, the non-volatile memory 120 may include an M-number of blocks 302. Each block 302 may include an N-number of pages 304, and each page may include a P-number of management units 306. A page of data 304 may be a minimum unit of read data. That is, when the storage controller 110 wants to read data from the non-volatile memory 120, it may read one or more pages of data. A management unit of data 306 may be a minimum unit of addressable data that the ECC engine 118 can process. The non-volatile memory 120 may be divided in other or additional ways. For example, multiple blocks 302 and pages 304 may be distributed across multiple arrays and operated together as metablocks and metapages, respectively. Alternatively, the distribution of blocks and pages may be confined to a single array or plane. As used herein, and unless otherwise specified, the terms "block" and "metablock" and the terms "page" and "metapage" may be used interchangeably and/or referred to collectively as "block" and "page" respectively, without concern for whether the block/metablock and page/metapage span a single array or multiple arrays.

Referring to FIG. 1, the storage module 100 may also include a voltage generator 130 configured to supply various voltages to cells of the non-volatile memory 120. For example, the voltage generator 130 may be configured to supply gate bias voltages at threshold voltage levels $V_{TH}$ to gates of the cells in the non-volatile memory 120 to read pages of data. The number of threshold voltage levels that may be applied to a cell may depend on the type of cell. For example, a single threshold voltage level may be supplied to single-level cells, two different threshold voltage levels may be supplied to double-level cells, and three different threshold voltage levels may be supplied to triple-level cells. Control of the voltage generator 130 and the voltages that the voltage generator 130 supplies to the non-volatile memory 120 may be controlled by the storage controller 110. Additionally, FIG. 1 shows the voltage generator 130 separate from the storage controller 110 and the non-volatile memory 120, although in other configurations, the voltage generator 130 may be part of the storage controller 110, may be "on-chip" with the memory elements of the non-volatile memory 120, may include multiple voltage generators as part of the same or different components of the storage module 100, or combinations thereof.

For some example configurations, the threshold voltage levels at which the gate bias voltages are supplied may be determined on a block-basis. That is, cells within the same block may receive gate bias voltages at the same threshold voltage levels. Additionally, each of the blocks may receive gate bias voltages at threshold voltage levels that are the same as or different than the threshold voltage levels of the gate bias voltages received by other blocks. Accordingly, the blocks of the non-volatile memory 120 may be grouped into threshold voltage bins, with the blocks in each bin receiving gate bias voltages at the same threshold voltage levels. Conversely, blocks in different threshold voltage bins may receive gate bias voltages at different threshold voltage levels. The storage controller 110 may track and update the threshold voltage bins and the blocks that are in each of the bins.

When a host read command is received from a host (e.g., the host 210 in FIG. 2A or the host 240 in FIG. 2B), data associated with the host read command that is read may be transferred from the non-volatile memory 120 to the storage controller 110. When the storage controller 110 receives the data, the ECC engine 118 may perform foreground error checking on the read data. When performing foreground error checking on the read data, the ECC engine 118 may detect or identify errors in the data. For example, the ECC engine 118 may perform error checking on and detect or identify errors for each of the management units (MU) in a page of data that is read.

Additionally, the ECC engine 118 may determine a bit error rate (BER) for each of the management units. The ECC engine 118 may also determine a bit error rate for a page. For some example configurations, a bit error rate for a page may be an average or arithmetic mean of the bit error rates of each of the management units of that page. For other example configurations, a bit error rate for a page may be a selected number or subset of the managements units of that page. For example, where the page spans a single plane, the bit error rate for the page may be the average or arithmetic mean of the bit error rates of the first and last management units in that plane. Alternatively, where the page spans multiple planes (i.e., a metapage), the bit error rate for the page may be the average or arithmetic mean of the bit error rates of the first and last management units of each of the multiple planes. Other ways to determine a bit error rate for a page of data based on management units may be possible.

After determining a bit error rate for a page, the ECC engine 118 may also compare the bit error rate with one or more thresholds. If the ECC engine 118 determines that the bit error rate exceeds one or more thresholds, then the ECC engine 118 may identify that a read error event has occurred.

A first read error event may occur if a bit error rate of a page of data exceeds a first threshold that indicates whether the errors identified in the page can be corrected by the ECC engine 118. If the bit error rate exceeds the first threshold, then the ECC engine 118 may identify the errors as uncorrectable. In response, the storage controller 110 may invoke one or more read error recovery mechanisms to attempt to read the data with a bit error rate below the first threshold. An example read error recovery mechanism may include threshold voltage calibration in which the threshold voltage levels of the gate bias voltages are adjusted (higher or lower) and applied to the gates of the cells. The data may be re-read and new bit error rates for the re-read data may be determined. The threshold voltage levels may be adjusted in predetermined increments, the data may be re-read, and new bit error rates may be determined until the data is re-read at an adjusted threshold voltage level that yields a correctable amount of errors, or until the threshold voltage levels may no longer be adjusted under the threshold voltage calibration process, such as if the threshold voltage levels have been incremented a maximum number of times or have reached maximum or minimum levels.

If the page of data is read with a bit error rate below the first threshold after invoking the error recovery mechanisms, then the ECC engine 118 may correct the errors. The ECC engine 118 may also identify the error event as an uncorrectable, recovered error event. Alternatively, if the invoked error recovery mechanisms are not able to lower the bit error rate to below the first threshold, then the ECC engine 118 may be unable to correct the errors and the page of read data may be unrecoverable. The ECC engine 118 may identify the error event as an uncorrectable and unrecoverable error event.

A second read error event may occur if a bit error rate of a read page of data is below the first threshold but above a second threshold. A bit error rate falling within this range may indicate that the errors in the page of data are correctable by the ECC engine 118, but the bit error rate is nonetheless at a sufficiently high level to indicate that the state of the data stored in its current location has deteriorated. As a result, loss of data retention may be imminent. Accordingly, bit error rates falling between the first and second thresholds may indicate that even though the errors are correctable, the data should be moved to a different location (such as to a different block) in the non-volatile memory 120. The ECC engine 118 may identify these second read error events as correctable error events.

The first and second read error events may be considered foreground read error events because they involve data that is read from the non-volatile memory 120 in response to a host read command. A third read error event may be a background read event, which may be an error event that is identified pursuant to an internal background read process (e.g., a read initiated internally by the storage controller 110 and not in response to a host read command). During a background process, read data may be sent to the ECC engine 118, which may determine that a bit error rate has exceeded the first or second thresholds.

In some situations, when the ECC engine 118 identifies a recoverable read error event, the storage controller 110 may perform "garbage collection" on the data to dispose of the read error event and/or prevent subsequent read error events from occurring. A garbage collection process may include moving the data to a different location within the non-volatile memory 120, such as a different block. For some example configurations, only valid or non-obsolete data may be moved to a different memory location as part of the garbage collection process. Additionally, the old location storing the data may be "scrubbed" and re-used for subsequent write operations.

In some situations, when a read error event is determined for a page of data, the scope of the read error event may not be confined to that page. That is, for some situations, if a read error event is detected for a page of data, data stored in other, neighboring pages in the same block and/or in pages of other blocks that receive the same threshold voltage levels may also yield a read error event. The scope of a read error event may extend beyond just the page of data that was read for various reasons, such as due to defective memory, endurance, or read disturb. In the event that the ECC engine 118 detects a read error event for a page of data, but the scope of the error event is greater than the page of data, determining what the scope of the read error event is and performing appropriate read error event disposition proactively, rather than waiting until those other neighboring pages of data are read in response to a foreground host read command, may improve read and error correction efficiency.

When the ECC engine 118 identifies a read error event for a chunk of data, such as a page or a management unit, the storage controller 110 may determine the scope or extent of the error within the non-volatile memory 120. In particular, the storage controller 110 may determine whether the scope of the read error event is a page-level read error event in which the scope is limited to the page yielding the read error event, a block-level read error event in which the scope is expanded to be associated with the block in which the page is located, or a threshold voltage bin-level read event error in which the scope is further expanded to include multiple blocks that are grouped in the same threshold voltage bin.

To determine the scope of the read threshold error, when the ECC engine 118 determines a read error event for a page of data in a block, the-storage controller 110 may determine whether the scope of the read error event may be expanded to the block level. To do so, the storage controller 110 may select a number of other pages in the block and generate a composite bit error rate for the block based on bit error rates of the selected other pages, and compare the bit rate for the initial page with the composite bit error rate of the block. Based on the comparison, the storage controller 110 may determine whether the scope of the read threshold error may be expanded to the block level or confined to the page.

For some example implementations, the storage controller 110 may select all of the other pages in the block. For other example implementations, the storage controller 110 may select a subset of the other pages in the block. The subset may include a percentage of the pages, a predetermined number that is less than all of the other pages, or one or more pages at one or more fixed predetermined offsets within the block, as examples. The subset of pages may be selected in any number of different ways, such as randomly or in accordance with a predetermined pattern. For example, the selected pages may be every Nth page from the initial read page that triggered the read error event, where N is an integer 2 or greater. As an example, if N=5 and the initial page triggering the read error event is page 2, then the selected pages may include page 7, page 12, page 17, and so on. Various implementations or combinations of implementations may be possible for selecting the pages.

After the pages are selected, a bit error rate may be determined for each of the selected pages. For example, each of the selected pages may be read from the non-volatile memory and sent to the ECC engine 118, which may determine a bit error rate for each of the selected pages. After the bit error rates for the selected pages are determined, a composite bit error rate for the block may be determined. The composite bit error rate for the block may be determined in various ways, which may depend on the memory technology and/or which may be determined after proper characterization of the bit error rate. For some example configurations, the composite bit error rate for the block may be or at least based on the average or arithmetic mean of the bit error rates of the selected pages. For other example configurations, the composite bit error rate for the block may be or at least based on the maximum bit error rate of the bit error rates of the selected pages. Other ways to determine the composite bit error rate for the block may be possible.

After the composite bit error rate for the block is determined, the storage module controller 110 may then compare the bit error rate for the page that triggered the read error event with the composite bit error rate for the block. If the bit error rate for the triggering page is greater than the composite bit error rate for the block, then the storage controller 110 may determine that the scope of the read error event is confined to the triggering page and does not extend to the block. Alternatively, if the bit error rate for the triggering page is less than the composite bit error rate for the block, then the storage controller 110 may determine that the scope of the read error event covers the block that includes the page.

If the storage controller 110 determines that the scope of the read error event expands to the block, then the storage module controller 110 may determine whether the scope of the read error event further expands to other blocks that are part of the same threshold voltage bin. To do so, the ECC engine 118 may determine composite bit error rates for all or at least a subset of the other blocks in the threshold voltage bin. In addition, for each of the other blocks, pages may be selected and composite bit error rates for each of the blocks may be determined based on the selected pages. After the composite bit error rates for each of the blocks are determined, the storage controller 110 may determine a composite bit error rate for the threshold voltage bin. The storage controller 110 may determine the composite bit error rate for the threshold voltage bin in a similar way as it determines the composite bit error rate for the block. For example, the composite bit error rate for the threshold voltage bin may be or at least based on the average or arithmetic mean of the composite bit error rates of the selected blocks. For other example configurations, the composite bit error rate for the threshold voltage bin may be or at least based on the maximum composite bit error rate of the composite bit error rates of the selected blocks. Other ways to determine the composite bit error rate for the threshold voltage bin may be possible.

After the storage controller 110 determines the composite bit error rate for the threshold voltage bin, the storage controller 110 may then compare the composite bit error rate for the initial block with the composite bit error rate for the threshold voltage bin. If the composite bit error rate for the initial block is greater than the composite bit error rate for the threshold voltage bin, then the storage controller 110 may determine that the scope of the read error event is limited to the initial block. Alternatively, if the composite bit error rate for the initial block is less than the composite bit error rate for the threshold voltage bin, then the storage controller 110 may determine that the scope of the read error event expands beyond the initial block and covers the blocks in the threshold voltage bin.

After the storage controller 110 determines the scope of the read error event, the storage controller 110 may be configured to take corrective action to dispose of the read error event according to the scope. In general, disposing of a read error event may include performing one or more corrective actions associated with the data for which a read error event was triggered so that a subsequent read of the data does not yield the read error event. The following is an example read error event disposition process that the storage controller 110 may perform. The corrective action or actions that the storage controller 110 takes may depend on the scope of the read error event—that is whether the scope is on the page level, the block level, or the threshold voltage bin level.

If the scope of the read error event is limited to the page yielding the read error event, then the page and only the page in the block may be moved to a different location in the non-volatile memory 120.

Alternatively, if the scope of the read error event expands to the block-level but not to the threshold voltage bin-level, then the storage controller 110, using the voltage generator 130, may perform threshold voltage calibration for the block to determine a new bit error rate for the block and whether the new bit error rate falls below a threshold value. During threshold voltage calibration for the block, the threshold voltage levels may be adjusted, gate bias voltages at the adjusted levels may be supplied to the block, and pages of data may be read with the gate of the cells receiving the gate bias voltages at the adjusted levels. The pages that are read may include all or a subset of the block. For some example configurations, the pages that are read may be those pages that were selected when determining the scope of the read error event as described above. The ECC engine 118 may determine new bit error rates for the read pages of data. The storage controller 110 may then determine a new composite bit error rate for the block and compare the new composite bit error rate for the block with a threshold value, which may be a fixed and/or predetermined value.

During the threshold voltage calibration for the block, the storage controller 110, using the ECC engine 118 and the voltage generator 130, may iteratively adjust the threshold voltage levels and determine new composite bit error rates for the block until a new composite bit error rate for the block falls below the threshold value or until the threshold voltage calibration process reaches an endpoint without the composite block bit error rate falling below the threshold value. An endpoint in the process may occur when the storage controller 110 determines that no more threshold voltage level adjustments may be made.

When comparing a new composite bit error rate for the block with the threshold value, if the new bit error rate is below the threshold value, then the storage controller 110 may determine that appropriate corrective action for disposition does not include relocation of the block of data. Instead, the storage controller 110 may determine to perform subsequent read operations on the block with the gate bias voltages being set to the last adjusted threshold voltage levels. The storage controller 110 may also determine whether the adjusted threshold voltage levels correspond to any existing threshold voltage bins. If so, then the storage controller 110 may update the bins by placing the block into an existing bin having a matching threshold voltage level. Alternatively, if no bins having a matching threshold voltage level exist, then the storage controller 110 may create a new bin for the block.

Alternatively, if the threshold voltage calibration process has reached an endpoint and a new composite bit error rate for the block has not fallen below the threshold value, then the storage controller 110 may determine to perform garbage collection on the block and relocate the block of data to a new location in the non-volatile memory 120.

If the scope of the read error event further expands to the threshold voltage bin-level, then the storage controller 110, using the voltage generator 130, may perform threshold voltage calibration for the blocks in the threshold voltage bin to determine a new composite bit error rate for the threshold voltage bin and whether the new composite bit error rate falls below a threshold value, which may be a fixed and/or predetermined value, and which may the same as or different than the threshold value that is compared with the new composite bit error rates for the block. During threshold voltage calibration for the threshold voltage bin, the threshold voltage levels may be adjusted, gate bias voltages at the adjusted levels may be supplied to the blocks in the threshold voltage bin, and pages of data in the blocks may be read with the gates of the cells receiving the gate bias voltages at the adjusted levels. For some example configurations, the blocks and pages within the blocks that are read may be those blocks and pages that were selected when determining the scope of the read error event as described above. The ECC engine 118 may determine new bit error rates for the read pages of data, and calculate new composite bit error rates for each of blocks. The storage controller 110 may then determine a new composite bit error rate for the threshold voltage bin and compare the new composite bit error rate for the threshold voltage bin with the threshold value.

During the threshold voltage calibration for the threshold voltage bin, the storage controller 110, using the ECC engine 118 and the voltage generator 130, may iteratively adjust the threshold voltage levels and determine new composite bit error rates for the threshold voltage bin until a new bit error rate for the threshold voltage bin falls below the threshold value or until the threshold voltage calibration process reaches an endpoint without the bit error rate for the threshold voltage bin falling below the threshold value. An endpoint in the process may occur when the storage controller 110 determines that no more threshold voltage level adjustments may be made.

When comparing a new composite bit error rate for the threshold voltage bin with the threshold value, if the new composite bit error rate is below the threshold value, then the storage controller 110 may determine that appropriate corrective action for disposition does not include relocation of the blocks that are part of the threshold voltage bin. Instead, the storage controller 110 may set the threshold voltage parameters for that bin to the last threshold voltages used to achieve a composite bit error rate below the threshold value. Subsequent read operations on the blocks in the threshold voltage bin may then be performed using the updated threshold voltage parameters.

Alternatively, if the threshold voltage calibration process has reached an endpoint and a new composite bit error rate for the threshold voltage bin has not fallen below the threshold value, then the storage controller 110 may determine to perform garbage collection on the block and relocate the block of data to a new location in the non-volatile memory 120.

In addition to determining the scope of a read error event and disposing of the read error event according to the scope, the storage controller 110 may be configured to dynamically keep track of error statistics or other information associated with the read error events. In one example implementation, the storage controller 110 may dynamically maintain a data structure (e.g., a table, list, or database) that includes an entry for each management unit triggering a read error event and information associated with the read error event.

Figure 4:
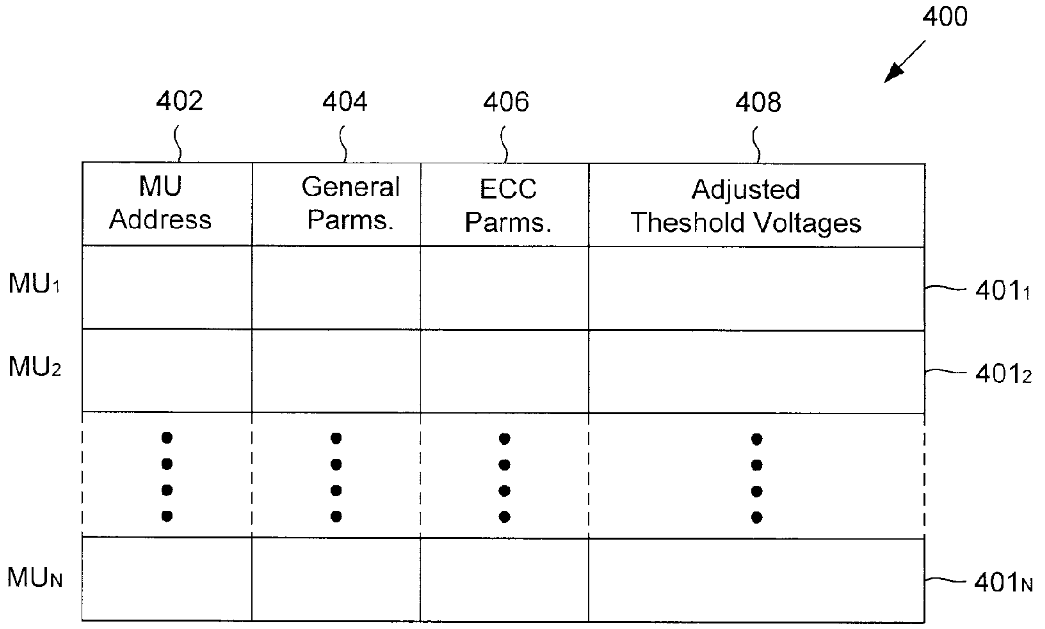
FIG. 4 is schematic diagram of a read error event table.

FIG. 4 shows an example read error event table 400 that may be used to dynamically keep track of information associated with read error events. Each row in the table may be an entry 401 for a management unit that triggered a read error event when read. In addition, each of the entries 401 may include information characterizing and/or identifying a management unit and information about the read error event for the management unit. The information may be generally categorized into different fields, including an address field 402 that identifies the address of the management unit, a general parameters field 404 that identifies general or initial parameters of the management unit and the associated read error event, an ECC parameters field 406 that identifies information about the ECC engine 118 as it relates to error checking the management unit, and an adjusted threshold voltages field 408 that identifies information about any threshold voltage levels that were adjusted when correcting the errors. For some implementations, if one or more of the threshold voltages were adjusted from their original levels, the adjusted threshold voltages field 408 may identify those voltages, which may indicate the last threshold voltage levels used to read the management unit, and depending on the other information in the read error event table 400, may also indicate the threshold voltage levels used to reduce the bit error rate of the management unit to an acceptable level. Additionally, for some implementations, the number of threshold voltages indicated may correspond to the type of memory cells making up the management unit. For example, an entry for single-level-cell management units may identify a single threshold voltage level, an entry for double-level-cell management units may identify three threshold voltage levels, and an entry for triple-level-cell management units may identify seven threshold voltage levels. Other numbers of threshold voltage levels may be possible, depending on the type of cell.

Figure 5:
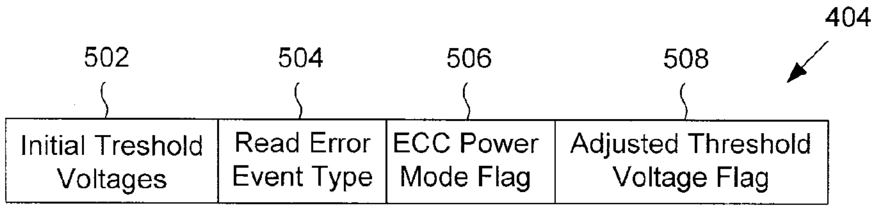
FIG. 5 is schematic diagram of a field for entries of the read error event table of FIG. 4.

FIG. 5 shows the general parameters field 404 in further detail. The general parameters field 404 may include an initial threshold voltages sub-field 502 that identifies initial or original threshold voltage levels at which gate bias voltages were supplied to read the associated management unit. The information in the sub-field 502 may identify or be used to identify the threshold voltage bin to which the associated management unit belongs. The general parameters field 404 may also include a read error event type sub-field 504 that identifies the type of read error event. As previously described, such read error event types may include foreground uncorrectable and unrecoverable, foreground uncorrectable and recoverable, foreground correctable, and background correctable.

The general parameters field 404 may further include an ECC power mode flag sub-field 506 that includes a flag indicating whether the ECC engine 118 entered a high power mode or stayed in a default, low power mode when performing error correction. The general parameters field 404 may also include an adjusted threshold voltage flag sub-field 508 that identifies whether any threshold voltage levels were adjusted while performing error recovery. If the flag in the adjusted threshold voltage sub-field 508 indicates that none were adjusted, then the storage controller 110 may know that the initial threshold voltages identified in sub-field 502 were the last threshold voltages used to read the management unit. Alternatively, if the adjust threshold voltage sub-field 508 indicates that at least one of the threshold voltage levels were adjusted, then the storage controller 110 may know to analyze the adjusted threshold voltages field 408 to identify the last threshold voltage levels that were used to read the management unit.

Figure 6:
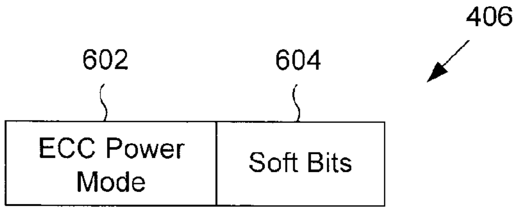
FIG. 6 is a schematic diagram of another field for entries of the read error event table of FIG. 4.

FIG. 6 shows the ECC parameters field 406 in further detail. The ECC parameters field may include an ECC power mode sub-field 602 that identifies a power mode in which the ECC engine 118 operated to correct the errors. In general, ECC engines may be configured to operate in different power modes, with the higher the mode, the greater the engine's correction capability but the more power it consumes. The ECC parameters field 406 may also include a soft bits sub-field 604 identifying a number of "soft bits" that the ECC engine 118 used when performing a soft bit read operation at soft bit compare points.

Referring to the read error event table 400 in FIG. 4, when the ECC engine 118 initially performs error checking on a management unit of data and identifies a read error event, the storage controller 110 may create an entry in the read error event table 400 for that management unit. When an entry is created, some information to be included in the entry may be initially known to the storage controller 110, such as the address of the management unit, the original threshold voltage levels, and the read error event type as examples. The storage controller 110 may populate the fields 402-408 with the known information at the time the entry is created. Other information to be included in an entry may not be known to the storage controller 110 upon creation of the entry, and instead may be determined after error correction and/or recovery mechanisms are invoked. Such information may include the power mode of the ECC engine 118 or adjusted threshold voltage levels, as examples. The storage controller 110 may populate the entries in the table as the error correction and/or recovery mechanisms are performed and the storage controller 110 obtains the information For some example configurations, the storage controller 110 may use entries in the table as a starting point for starting the read error event scope and/or disposition processes. For example, the read error event scope and/or disposition processes may be performed as a background process by the storage controller 110, even if the initial read error event was identified during a foreground read operation. After a read error event is identified for a management unit, an entry may be created in the table 400 and populated with information in the fields 402-408 as the information becomes known to the storage controller 110. When the storage controller 110 determines that it is has resources available to run a background process, the storage controller 110 may use the read error event table 400 to select or identify a management unit for which to determine the scope and dispose of the associated read error event according to the scope.

For some example configurations, the storage controller 110 may retrieve the entries in the table 400 on a first-in-first-out (FIFO) basis. In addition or alternatively, the storage controller 110 may select the entries in accordance with a priority scheme. One priority scheme may be based on the read error event type. In one example implementation of such as scheme, foreground uncorrectable read error events may have a higher priority over foreground correctable read error events, which in turn may have a higher priority over background correctable read error events. The storage controller 110 may select an entry with a higher priority before it selects an entry with a lower priority. After the storage controller 110 selects an entry, the storage controller 110 may determine the scope of the read error event associated with the selected management unit and then dispose of the read error event according to the scope, as previously described.

Additionally, the storage controller 110 may use the information included in the selected entry to perform at least some of the scope and disposition processes. For example, the storage controller 110 may use the address of the management unit identified in the address field 402 to identify neighboring pages in a block in order to determine the composite bit error rate for the block. Additionally, the storage controller 110 may use the information in the initial threshold voltages sub-field 502 to identify the threshold voltage bin to which selected management unit belongs. Also, for some example configurations, after the storage controller 110 disposes of the read error event, the storage module 110 may then remove the corresponding entry in the read error event table 400.

In addition or alternatively to using the table 400 as a starting point for the read error event scope and disposition process, the storage controller 110 may use the read error event table 400 as a starting or preliminary point before performing read error recovery. As previously described, if the ECC engine 118 determines that a bit error rate exceeds the first threshold, the ECC engine 118 may identify the errors as uncorrectable and invoke one or more read error recovery mechanisms to attempt to read the management unit with a bit error rate below the first threshold. For some example configurations, in the event that the ECC engine 118 determines that a bit error rate has exceeded the first threshold level, the storage controller 110 may first search the table 400 to determine whether the management unit matches an entry in the read error event table 400. The management unit may match an entry in the read error event table 400 if it exactly matches an entry (i.e., its address matches one of the addresses in the read error event table 400), or if the management unit is included in the same block as another management unit having an entry in the read error event table 400, or if the management unit is part of the same threshold voltage bin as another management unit having an entry in the read error event table. The storage controller 110 may use the initial threshold voltages field 502 to determine whether management unit is in the same block or threshold voltage bin as another management unit having an entry in the table 400.

If the storage controller 110 does not identify a match, then the storage controller 110 may proceed with performing read error recovery without using information in the read error event table 400. Alternatively, if the storage controller 110 identifies a match, then the storage controller 110 may select an entry for which there is a match and perform a preliminary read error recovery procedure with information included in the selected entry. For example, if the selected entry identifies that one or more threshold voltage levels are adjusted from their original levels, the storage controller 110 may set gate bias voltages to the adjusted threshold levels identified in the entry and perform a subsequent read and bit error rate calculation on the re-read management unit. In addition or alternatively, when performing the error correction, the ECC engine 118 may be configured to have the ECC engine settings identified in the entry, such as the power mode setting and the number of soft bits identified in sub-fields 602, 604 (FIG. 6). After re-reading the data and/or calculating the bit error rate with the information used in the selected entry, the storage controller 110 may determine whether the bit error rate for the management unit falls below a threshold value. If it does, then the storage controller 110 may forego read error recovery that follows the preliminary procedure involving use of information in the table 400. Alternatively, if it does not, then the storage controller 110 may perform the read error recovery.

Figure 7:
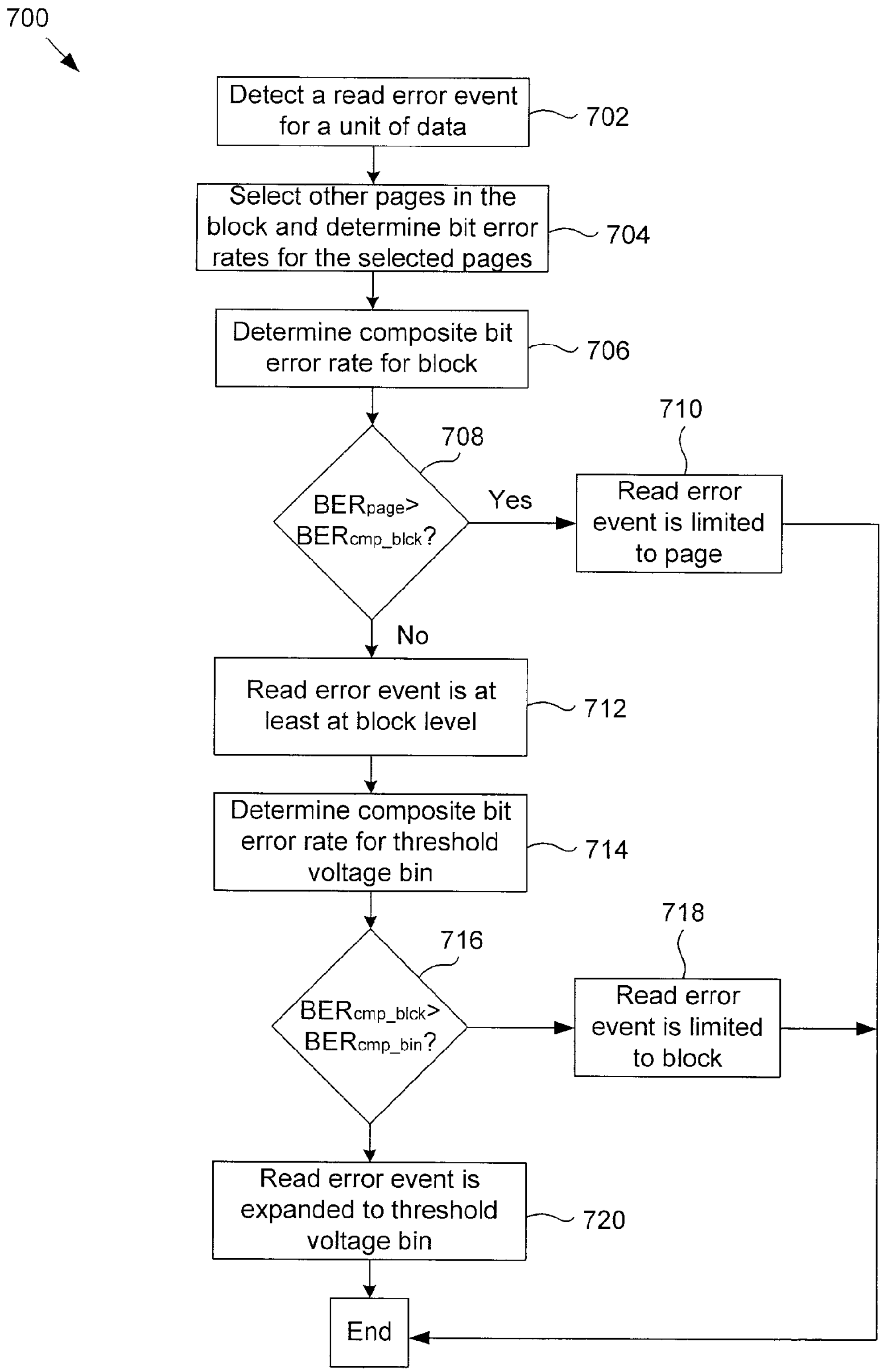
FIG. 7 is a flow chart of an example method of determining the scope of a read error event.

FIG. 7 shows a flow chart of an example method 700 of determining the scope of a read error event within a memory of a storage module. The memory may be partitioned into a plurality of blocks, with each block including a plurality of pages, and with each page being a minimum unit of read data. At block 702, a correction engine of the storage module may determine a read error event for a page of data stored in the memory. An error event may be determined when the correction engine calculates a bit error rate for the page that is greater than a threshold level, as previously described. At block 704, a storage controller of the storage module may select other pages in the block and the correction engine may determine bit error rates for each of the selected pages. At block 706, based on bit error rates for the selected pages, the storage controller may determine a composite bit error rate for the block.

At block 708, the storage controller may compare the bit rate of the page ($BER_{page}$) triggering the read error event with the composite bit error rate for the block ($BER_{cmp\_blck}$) to see which bit error rate is greater. If the bit error rate of the page is greater than the composite bit error rate of the block, then at block 710, the storage controller may determine that the read error event is limited to the page triggering the read error event. Alternatively, if the bit error rate of the page is less than the composite bit error rate of the block, then at block 712, the storage controller may determine that the scope of the read error event expands at least to the block in which the page is located.

At block 714, the storage controller may determine a composite bit error rate for blocks that are in the same threshold voltage bin. To do so, the storage controller may determine composite bit error rate for each of at least a subset of the blocks that are in the same threshold voltage bin. The storage controller may then determine the composite bit error rate for the threshold voltage bin based on the composite bit error rates of the blocks. At block 716, the storage controller may compare the composite bit error rate for the initial block with the composite bit error rate for the threshold voltage bin to determine which bit error rate is greater. If the bit error rate for the initial block is greater, then at block 718, the storage controller may determine that the read error event is limited to the block in which the page triggering the read error event is located. Alternatively, if the composite bit error rate for the threshold voltage bin is greater, than at block 720, the storage controller may determine that the read error event expands to the blocks that are part of the same threshold voltage bin.

Figure 8:
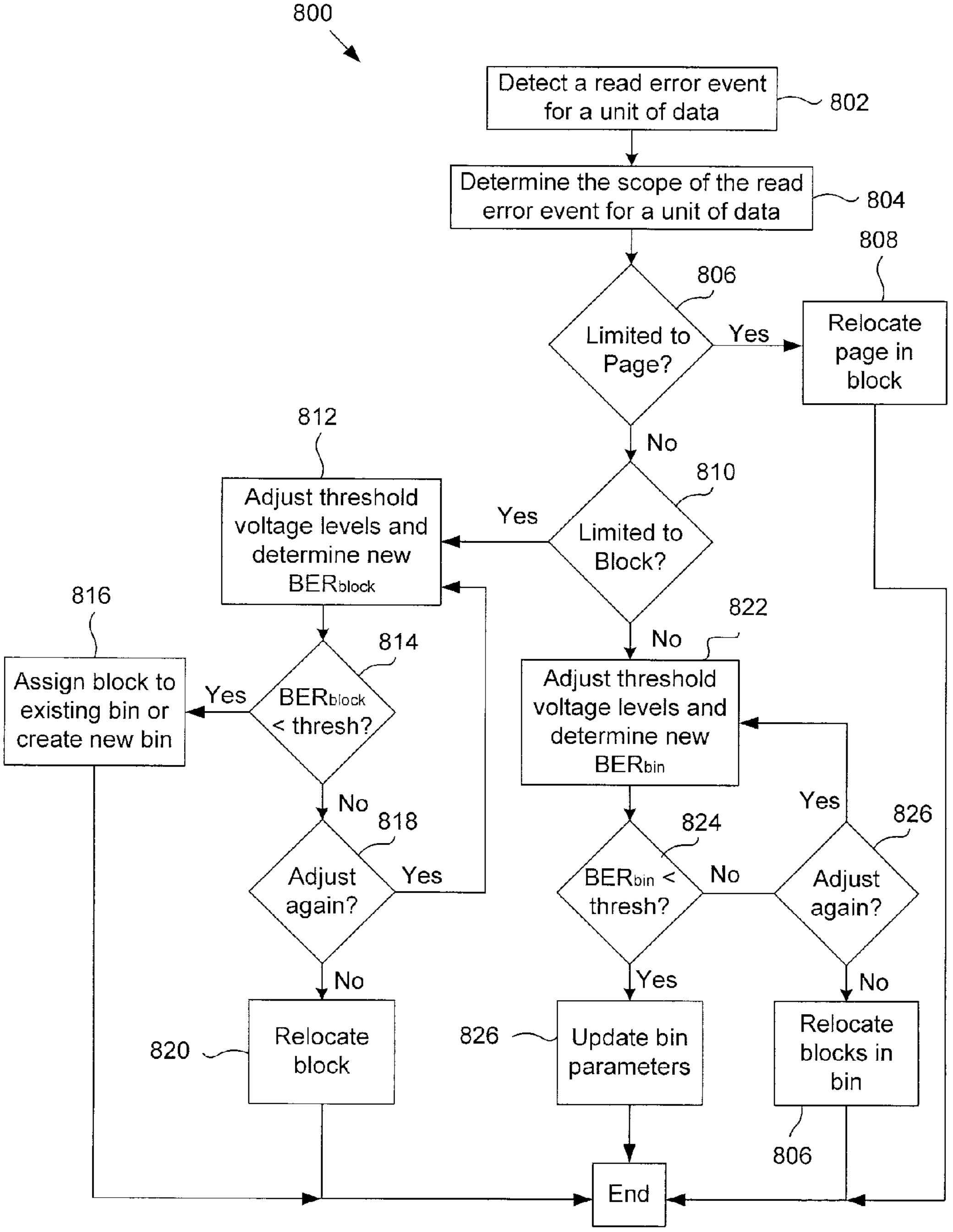
FIG. 8 is a flow chart of an example method of disposing of a read error event according to a scope of the read error event.

FIG. 8 is a flow chart of an example method 800 of disposing of a read error event according to a scope of the read error event. The example method 800 may be performed in a storage module in which the read error event occurs. In some examples, the method 800 may be performed as part of a background process of the storage module, although in other examples, the method 800 may be considered a foreground process.

At block 802, a storage controller of the storage module may determine a read error event for a unit of data of a memory of the storage module. In some examples, the storage controller may determine the read error event by selecting or retrieving an entry in a data structure that identifies a unit of data and information relating to a read error event when the unit of data was read, such as an entry in the read error event table 400 previously described. For other examples, the storage controller may determine the read error event when a correction engine of the storage module determines that the unit of data has a bit error rate that exceeds a threshold level.

At block 804, the storage controller may determine the scope of the read error event. As previously described, the scope may be limited to a page that includes the unit of data, may cover a block of data that includes the page but not expand beyond the block, or may expand beyond the block and cover blocks in the same threshold voltage bin.

At block 806, if the scope of the read error event is confined to the page that includes the unit of data, then at block 808, the page may be relocated to a different location in the memory and the disposition method 800 may end.

Alternatively, at block 806, if the scope of the read error event expands beyond the page, then at block 810, if the scope does not expand beyond the block, then at block 812, the storage controller, using a voltage generator, may adjust one or more threshold voltage levels under a threshold voltage calibration process, and supply gate bias voltages at the adjusted levels to the block to read pages of the block. In addition, at block 812, a correction engine may determine bit error rates for the pages, and the storage controller may determine a new composite bit error rate for the block based on bit error rates of the pages.

At block 814, the storage controller may compare the new composite bit error rate for the block with a threshold value. If the new composite bit error rate is below the threshold value, then at block 816, the storage controller may determine that appropriate corrective action for disposition does not include relocation of the block. Instead, the storage controller may determine to perform subsequent read operations on the block with the gate bias voltages being set to the last adjusted threshold voltage levels. The storage controller may also assign the block to a new threshold voltage bin having threshold voltages that match the adjusted threshold voltages last applied to the block, or create a new bin for the block if no bin with matching threshold voltages exists.

Alternatively, if the new composite bit error rate for the block is above the threshold value, then at block 818, the storage controller may determine whether to continue adjusting the threshold voltage levels under the threshold voltage calibration process. If so, then the method 800 may proceed back to block 812, where the storage controller, using the ECC engine and the voltage generator, may adjust the threshold voltage levels and determine a new composite bit error rate for the block. Alternatively, at block 818, if the storage controller determines that the threshold voltage calibration process has ended, then at block 812, the storage controller may determine that the corrective action is to relocate the block of data to a different location in the memory to dispose of the read error event.

Referring back to block 810, if the scope of the read error event expands beyond the block and covers the blocks in same threshold voltage bin, then at block 822, the storage controller, using the voltage generator, may adjust one or more threshold voltage levels under a threshold voltage calibration process, and supply gate bias voltages at the adjusted levels to the blocks to read pages from the blocks. In addition, at block 822, the correction engine may determine composite bit error rates for the blocks, and the storage controller may determine a new composite bit error rate for the threshold voltage bin based on the composite bit error rates for the blocks.

At block 824, the storage controller may compare the new composite bit error rate for the bin with a threshold value. If the new composite bit error rate is below the threshold value, then at block 826, the storage controller may determine that appropriate corrective action for disposition does not include relocation of the block. Instead, as the corrective action, the storage controller may update the threshold voltage parameters for the bin, and gate bias voltages at the adjusted threshold voltage levels may be supplied to blocks in the bin during subsequent read operations.

Alternatively, at block 824, if the new composite bit error rate for the threshold voltage bin is above the threshold, then at block 826, the storage controller may determine whether to continue adjusting the threshold voltage levels under the threshold voltage calibration process. If so, then the method 800 may proceed back to block 822, where the storage controller, using the ECC engine and the voltage generator, may adjust the threshold voltage levels and determine a new composite bit error rate for the threshold voltage bin. Alternatively, at block 826, if the storage controller determines that the threshold voltage calibration process has ended, then at block 828, the storage controller may determine that the corrective action is to relocate the blocks in the threshold voltage bin to a different location in the memory to dispose of the read error event.

Figure 9:
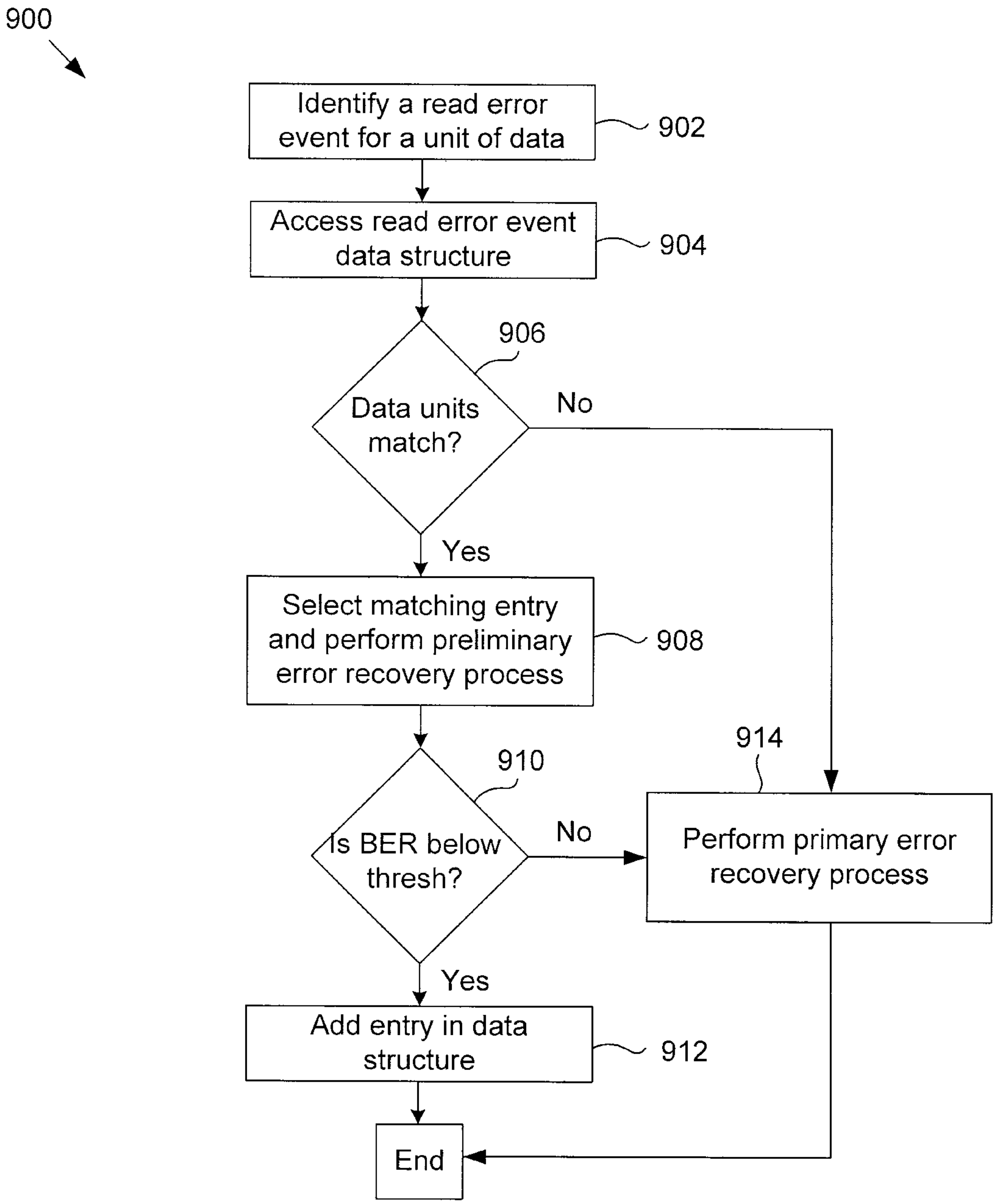
FIG. 9 is a flow chart of an example method of performing a preliminary read error event lookup during a read error recovery process in a storage module.

FIG. 9 is a flow chart of an example method 900 of performing a preliminary read error event lookup during a read error recovery process in a storage module. At block 902, a correction engine of a storage controller of the storage module may identify an uncorrectable read error event for a data unit that requires one or more read error recovery processes to be performed on the data unit in an attempt to move the error level of the data down to a correctable level. Example read error recovery processes may include configuring the storage module in DSP mode, forcing known read levels to avoid misreading internal flag bytes, adjusting read threshold voltage levels under a calibration process (such as a cell voltage distribution (CVD) calibration process), performing soft bit reads, and XOR parity recovery mechanisms. Other read error recovery processes may be possible.

At block 904, before performing one or more of the read error recovery processes, the storage controller may access a read error event data structure including entries of data units and information relating to read error events associated with the data units, such as the read error event table 400 shown and described with reference to FIGS. 4-6. At block 906, the storage controller may analyze the entries in the data structure and determine whether the data unit matches any of the entries in the data structure. A match may occur if an address of the data unit matches any of the addresses for any of the data structures identified in the data structure. Alternatively, a match may occur if the storage controller identifies that the data unit is stored in the same block or group of blocks receiving gate bias voltages at the same threshold voltage levels.

If a match does not occur, then the method 900 may proceed to block 914 where the primary read error recovery mechanism may be performed. Alternatively, if a match occurs, then at block 908, the storage controller may select the matching entry and perform a preliminary error recovery process for the data unit using the information included in the selected entry. The preliminary error recovery process may include setting the gate bias voltage levels to adjusted gate bias voltage levels identified in the entry. In addition or alternatively, the preliminary error recovery process may include operating the correction engine in the power mode identified in the entry. In addition or alternatively, the preliminary error recovery process may include using the number of soft bits identified in the entry. Under the preliminary error recovery process using the information included in the entry, the correction engine may determine a bit error rate for the data unit.

At block 910, the correction engine may determine if the bit error rate for the data unit falls below a threshold such that the error in the data unit are correctable. If so, then at block 912, the storage controller may decide to bypass the primary error recovery process. Additionally, the storage controller may add an entry in the data structure that identifies the data unit and include the information used in the preliminary recovery process. Referring back to block 910, if the bit error rate for the data unit is above the threshold, then at block 914, the storage controller may perform the primary error recovery process to attempt to recover the data.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A method for analyzing a read error event, the method comprising:

performing the following in a storage module having a memory partitioned into a plurality of blocks, wherein each block comprises a plurality of pages:

reading a page of data stored in the memory;

determining a read error event for the page of data; and determining whether a scope of the read error event in the memory is limited to the page or covers a block that includes the page by:

determining bit error rates for other pages of the block;

determining a composite bit error rate for the block based on the bit error rates for the other pages; and comparing a bit error rate for the page with the composite bit error rate for the block;

wherein the scope is limited to the page when the bit error rate for the page is greater than the composite bit error rate for the block, and wherein the scope covers the block when the composite bit error rate for the block is greater than the bit error rate for the page.

2. The method of claim 1, wherein identifying the scope of the read error event further comprises: when the scope covers the block, determining whether the scope is limited to the block or covers a plurality of blocks that receive gate bias voltages at the same threshold voltage levels.

3. The method of claim 2, wherein determining whether the scope is limited to the block or covers a plurality of blocks that receive gate bias voltages at the same threshold voltage levels comprises:

determining that the scope is limited to the block when a composite bit error rate for the block is greater than a composite bit error rate for the plurality of blocks; and determining that the scope covers the plurality of blocks when the composite bit error rate for the block is less than the composite bit error rate for the plurality of blocks.

4. The method of claim 1, further comprising:

disposing of the read error event according to the scope.

5. The method of claim 4, wherein disposing of the read error event according to the scope comprises:

when the read error event is limited to the page, relocating the page in the memory without performing threshold voltage level calibration.

6. The method of claim 4, wherein disposing of the read error event according to the scope comprises:

when the read error event covers the block but does not expand beyond the block:

adjusting a threshold voltage level one or more times to obtain one or more bit error rates for the block;

when an adjusted threshold level yields one of the one or more bit error rates for the block to be below a threshold level, setting the threshold voltage level for subsequent reads of the block to the adjusted threshold voltage level; and relocating the block in the memory when none of the one or more bit error rates is below the threshold level.

7. The method of claim 4, wherein disposing of the read error event according to the scope comprises:

when the read error event covers a plurality of blocks that receive gate bias voltages at the same threshold voltage levels:

adjusting a threshold voltage level to obtain one on or more bit error rates for the plurality of blocks;

when an adjusted threshold level yields one of the one or more bit error rates for the block to be below a threshold level, setting the threshold voltage level for subsequent reads of the plurality of blocks to the adjusted threshold level; and relocating the plurality of blocks in the memory when none of the one or more bit error rates is below the threshold level.

8. The method of claim 1, further comprising:

maintaining a data structure of read error events, wherein the data structure includes an entry that identifies a read error event for a data unit of the page of data, and wherein the read error event for the page of data is determined by accessing the entry in the data structure.

9. The method of claim 1, wherein identifying the scope of the read error event is a background process.

10. The method of claim 1, wherein the memory is a three-dimensional memory.

11. The method of claim 1, wherein the storage module is embedded in the host.

12. The method of claim 1, wherein the storage module is removably connected to the host.

13. A method for performing a preliminary read error recovery, the method comprising:

performing the following in a storage module having a memory and a correction engine:

reading a first data unit from the memory and identifying a bit error rate for the first data unit with the correction engine;

determining that the bit error rate is above a threshold;

accessing a data structure including entries identifying data units and read error event information associated with the data units;

identifying a second data unit in an entry that matches the first data unit;

performing a preliminary read error recovery process on the first data unit using the information in the entry to reduce the bit error rate below the threshold; and determining to perform a primary read error recovery process on the data in response to the bit error rate being above the threshold, wherein the storage module accesses the data structure, identifies the second data unit in the entry, and performs the preliminary read error recovery process before performing the primary read error recovery.

14. A method for performing a preliminary read error recovery, the method comprising:

performing the following in a storage module having a memory and a correction engine:

reading a first data unit from the memory and identifying a bit error rate for the first data unit with the correction engine;

determining that the bit error rate is above a threshold;

accessing a data structure including entries identifying data units and read error event information associated with the data units;

identifying a second data unit in an entry that matches the first data unit;

performing a preliminary read error recovery process on the first data unit using the information in the entry to reduce the bit error rate below the threshold; and determining to perform a primary read error recovery process on the data in response to the bit error rate being above the threshold, wherein the storage module accesses the data structure, identifies the second data unit in the entry, and performs the preliminary read error recovery process before performing the primary read error recovery;

wherein the storage module does not perform the primary read recovery process when the preliminary read recovery process reduces the bit error rate below the threshold.

15. The method of claim 13, wherein the first data unit matches the second data unit when addresses of the first and second data units match, the first data unit and the second data unit are located in the same block, or the first data unit and the second data unit are located in blocks that receive gate bias voltages at the same threshold levels.

16. The method of claim 13, wherein the read error event information associated with the data units identifies one or more of the following: one or more adjusted threshold levels, a power mode of the correction engine, or a number of soft bits.

* * * * *